United States Patent [19]

Rose

[11] 4,272,817
[45] Jun. 9, 1981

[54] MULTIPLEXED SINGLE WALL DOMAIN GENERATORS

[75] Inventor: Donald K. Rose, Palo Alto, Calif.

[73] Assignee: Intel Magnetics, Inc., Santa Clara, Calif.

[21] Appl. No.: 25,848

[22] Filed: Apr. 2, 1979

[51] Int. Cl.³ .............................................. G11C 19/08
[52] U.S. Cl. .......................................... 365/12; 365/36
[58] Field of Search .................................... 365/11, 12

[56] References Cited

U.S. PATENT DOCUMENTS 3,958,211  5/1976  Suchtelen et al. ..................... 365/12

Primary Examiner—James W. Moffitt
Attorney, Agent, or Firm—Blakely, Sokoloff, Taylor & Zafman

[57] ABSTRACT

An improved magnetic domain generator for a magnetic arrangement employing a layer of garnet in which single wall domains (bubbles) are moved by an in-plane rotating magnetic field. A first domain generator includes a first propagation circuit for moving bubbles away from the generator when the rotating field is in a first direction. A second domain generator includes a second propagation circuit for moving bubbles away from the second generator when the rotating magnetic field is in an opposite direction to the first direction. The two generators are coupled to a common pulse source which is able to provide pulses at twice the rate of rotation of the magnetic field. In this manner, two independent streams of bubbles may be produced by the generators from a single pulse source.

10 Claims, 2 Drawing Figures

MULTIPLEXED SINGLE WALL DOMAIN GENERATORS

BACKGROUND OF THE INVENTION

1. Field of the Invention

The invention relates to the field of generating single wall magnetic domains.

2. Prior Art

Numerous single wall domain generators are well-known. These generators provide bubbles in response to an electrical signal, generally a pulse. Once a new bubble is generated it is moved along a propagation channel which originates adjacent to the generator. Domain generators generally fall into two categories. The first employs a seed domain which is split in what has been characterized as a "taffee-pulling operation" to generate additional domains. Examples of these generators are shown in U.S. Pat. Nos. 3,706,081; 3,706,082; and 3,781,833. In other generators, nucleation is employed to produce new domains through a magnetic field (U.S. Pat. No. 3,789,375) or through thermal nucleation (U.S. Pat. No. 3,786,452).

In magnetic bubble memories, a generator is employed to provide a stream of bubbles representing binary ones and zeros. This stream of bubbles is propagated in loops in a well-known manner to provide storage. These loops are arranged in a data storage block such as that shown in U.S. Pat. No. 3,838,407. A bubble generator is generally used along with reading circuitry for each data storage block. To increase the data rate of a bubble memory, a plurality of these blocks are used. However, this requires a plurality of bubble generators, one for each block, and an equal number of pulse generators to provide the electrical pulses for each of the bubble generators.

In the practical realization of bubble memory systems, a plurality of separate integrated circuit packages, which include a controller, pulse generators, read sensors and other circuits, are mounted on a printed circuit board along with the bubble memory. Numerous leads must interconnect the bubble memory with these other circuits. Among the leads are those which provide the electrical pulses to the bubble generators. Where a bubble memory includes a plurality of data storage blocks, additional leads are required to furnish pulses for each of the generators associated with each of the storage blocks. Thus, for example, if four data blocks are included on a single bubble memory substrate, four lines (in addition to a return line) are required to deliver the pulses to these generators.

It is necessary, from practical considerations, to minimize the number of leads which must be coupled to the bubble memory in a bubble memory system. Specifically, reducing the requirement for pins on the package which contains the bubble memory is important for the realization of a commercial bubble memory system.

As will be seen, the present invention allows two independent streams of bubbles to be generated from a single pulse generator. Thus, for example, four data storage blocks on a single substrate require only two leads (in addition to a return lead) to generate four independent streams of bubbles. Also, since two bubble generators are operated from a single pulse generator, the number of pulse generators is reduced.

SUMMARY OF THE INVENTION

An improved domain generation means is described for a magnetic apparatus which includes a magnetic layer of material in which single wall domains are moved. A first and a second domain generator, each for generating single wall domains, are employed. First propagation means are used to direct magnetic domains from the first generator; this first propagation means has a first orientation with respect to the first generator. Second propagation means are also used for propagating domains from the second generator. The second propagation means has a second orientation with respect to the second generator, which orientation is opposite the first orientation. In this manner, the first and second generators may be coupled to the same signal source and yet generate two independent streams of bubbles.

DETAILED DESCRIPTION OF THE INVENTION

Generation means for generating single wall magnetic domains (bubbles) are described. In particular, a pair of generators (in one embodiment) are coupled to a common pulse generator; these bubble generators are able to generate two independent streams of bubbles even though they both receive the same pulses from the pulse generator. In the following description, numerous specific details, such as specific shapes, are set forth to provide a thorough understanding of the present invention. However, it will be obvious to one skilled in the art that the invention may be practiced without these specific details. In other instances, well-known structures have not been described in detail in order not to obscure the present invention in unnecessary detail.

The bubble generation of the present invention may be employed in a plurality of different magnetic arrangements. In the presently preferred embodiment, the invention is used in a bubble memory where a plurality of data storage blocks are included on a single substrate. The magnetic arrangement employed in the presently preferred embodiment is generally well-known and includes a garnet substrate, specifically a gadolinum gallium garnet ($Gd_3Ga_5O_{12}$). An ion implanted magnetic garnet (epitaxial layer) is employed on the substrate for the magnetic storage layer. The single wall domains are moved in this layer in a well-known manner. Aluminum alloy conductors are fabricated on a silicon dioxide layer which is formed over the storage layer. Permalloy patterns are formed on a second silicon dioxide layer which covers the conductors. A permanent magnetic field for biasing the magnetic layer and an in-plane, rotating magnetic field are employed as is well-known.

Figure 1:
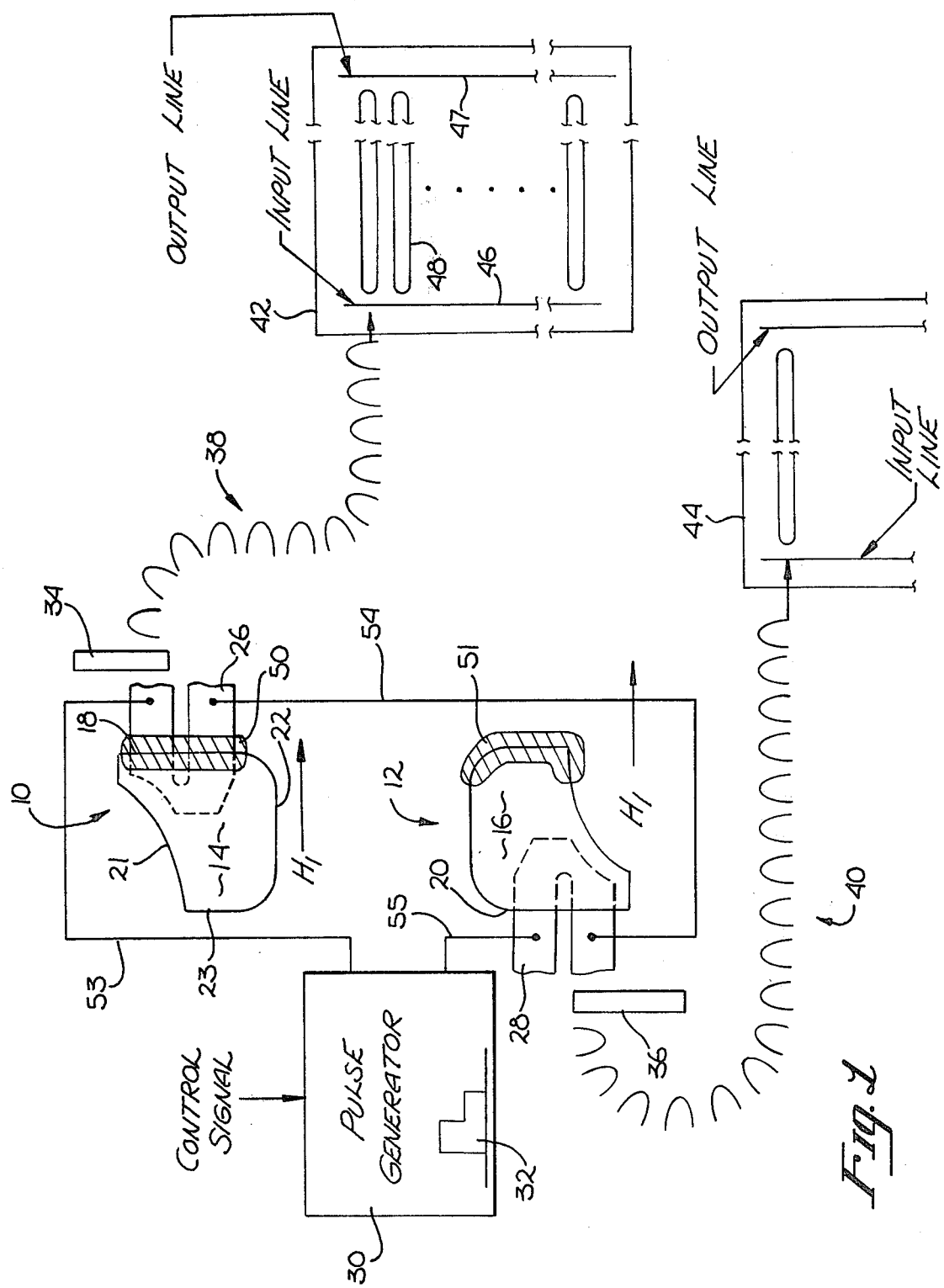
FIG. 1 is a plan view illustrating two bubble generators coupled to a single pulse generator and propagation circuitry for propagating the bubbles from the generators to two data storage blocks.

Referring now to FIG. 1, a pair of bubble generators 10 and 12 are illustrated. The bubbles generated by these generators are coupled to the data storage blocks 42 and 44 through the propagation circuits 38 and 40, respectively. In the presently preferred embodiment, the propagation circuit, in addition to the other propagation circuitry employed in the memory, consists of permalloy elements in a chevron configuration.

Each of the data blocks, such as the data block 42, includes an input line 46 and appropriate circuitry for transferring bubbles from the input line 46 to a selected one of the loops, such as loop 48. Similarly, data may be transferred from the loops to the output line 47. The data block 44 is arranged in an identical manner.

It is desirable for storing data in the data blocks 42 and 44 that two independent streams of data be generated and then coupled to the data storage blocks through the propagation circuits 38 and 40. With the improvement of the present invention, two independent streams of bubbles are generated by the generators 10 and 12 with the single pulse generator 30.

Referring now to the details of the bubble generator 10, this generator is of the general type which splits a seed domain in a well-known manner. The generator includes the permalloy disc member 14 defined from the permalloy layer. The disc member 14 includes a generally long side 18 which is opposite a shorter side 23. A concave section 21 interconnects the sides 18 and 23 and a generally convex section 22 interconnects the other ends of the sides 18 and 23.

The generator 12 includes an identical permalloy disc member 16; however, as may be readily seen in FIG. 1, this member is oriented differently than the disc member 14. Specifically, the disc member 16 is arranged in an opposite direction (rotated 180°) from the disc member 14. The long side 20 of the disc member 16 is on the opposite side of the generator 12 when compared to the side 18 of member 14. It should be noted that when the in-plane rotating magnetic field is in the direction indicated by $H_1$, a seed domain 50 is on the long side 18 of the disc member 14 while the same field causes seed domain 51 to be on the shorter side of the disc member 16.

Each of the generators 10 and 12 includes a "hairpin"-shaped conductor. The conductor 26 formed from the conductive aluminum layer forms a loop across the side 18 of the disc member 14. Similarly, although oppositely disposed, the hairpin-shaped conductor 28 forms a loop along the long side 20 of the disc member 16.

In the presently preferred embodiment, the conductors 26 and 28 are coupled in series to a pulse generator 30. The line 53 couples one output terminal of the pulse generator 30 to one end of the loop formed by the conductor 26. The line 54 connects the other end of the conductor 26 to one end of conductor 28. And line 55 couples the other output terminal of the pulse generator 30 to the other end of the conductor 28. With this coupling, a current pulse from generator 30 produces a magnetic field in the same direction in both generators 10 and 12.

A transfer element 34 is disposed adjacent to the long side 18 of the disc member 14 to permit movement of split domains from the disc member 14 onto the origin of the propagation circuit 38. Similarly, a transfer element 36 is disposed adjacent to the long side 20 of the disc member 16 to permit movement of split domains from the disc member 16 onto the propagation circuit 40. The origins of the circuits 38 and 40 are geometrically 180° apart.

In operation, assume that seed domains have been nucleated and that these domains are moving about the periphery of the disc members 14 and 16 under the influence of the in-plane rotating magnetic field. Thus, as mentioned, when this in-plane rotating field is in the direction indicated by $H_1$, the seed domains 50 and 51 are in the positions indicated in FIG. 1.

Assume that it is necessary to generate a bubble for the data storage block 42. With the seed domains in the position shown, the pulse generator 30 generates a pulse of the general waveform shown by waveform 32. The initial high current when passing through the loop of conductor 26 produces a magnetic field transverse to the in-plane rotating field. This splits the seed domain 50, allowing one portion to be transferred onto the transfer element 34 and onto the propagation circuit 38. This splitting and transferring occurs in a well-known "taffee-pulling" operation. The lower current shown in the second portion of the waveform 32 assists in the transfer of the split seed domain onto the propagation circuit 38. As may be seen from FIG. 1, when this splitting occurs from the domain 50, the domain 51 of generator 12 is spaced-apart from the conductor 28. The pulse of current applied to the conductor 26 also passes through the conductor 28, producing an equivalent magnetic field within the generator 20. However, since the seed domain 51 is spaced-apart from the conductor 28 at the time that the pulse occurs, no bubble is generated by the generator 12.

Now assume it is necessary to generate a bubble for the data storage block 44. This bubble is generated when the rotating magnetic field is in a direction opposite to that shown for $H_1$. Then the seed domain 50 of generator 10 is on the short side 23 of the disc member 14 and the seed domain 51 of the generator 12 is on the long side 20 of the disc member 16. If a pulse is generated at this time, the seed domain 51 is split and moved onto the element 36 and propagation circuit 40. However, at this time, since the domain 50 is on the short side 23 of the disc member 14, no new domain is generated by the generator 10.

Thus, by appropriately applying a control signal to the pulse generator 30, two independent streams of bubbles may be generated by the generators 10 and 12 and transferred to the blocks 42 and 44. In the presently preferred embodiment, the propagation circuits 38 and 40 are of equal lengths to simplify the management of these independent streams of bubbles and their transfer into the data blocks 42 and 44.

In the presently preferred embodiment, the pulse generator 30 provides a pulse of approximately 5 microsecond duration with an initial current of approximately 150 milliamps, which current is reduced to approximately 50 milliamps during the second portion of the waveform 32. As shown, the hairpin-shaped conductors 26 and 28 are connected in series with the pulse generator 30. This allows the same current to be easily delivered to both of these conductors. However, the conductors could be coupled in parallel in some applications.

Each of the generators requires an area of approximately 30 microns$^2$, as presently arranged. A magnetic field of approximately 300 oersteds is caused by the pulse and employed to split the seed domain. This field is far below the nucleation threshold.

While in the presently preferred embodiment, domain splitting generators are used, it will be apparent to one skilled in the art that the multiplexing principle shown in FIG. 1 may also be employed with the nucleation type of bubble generators. Also, while only two data blocks are shown in FIG. 1, any number of data blocks and generators may be included on a single substrate.

Figure 2:
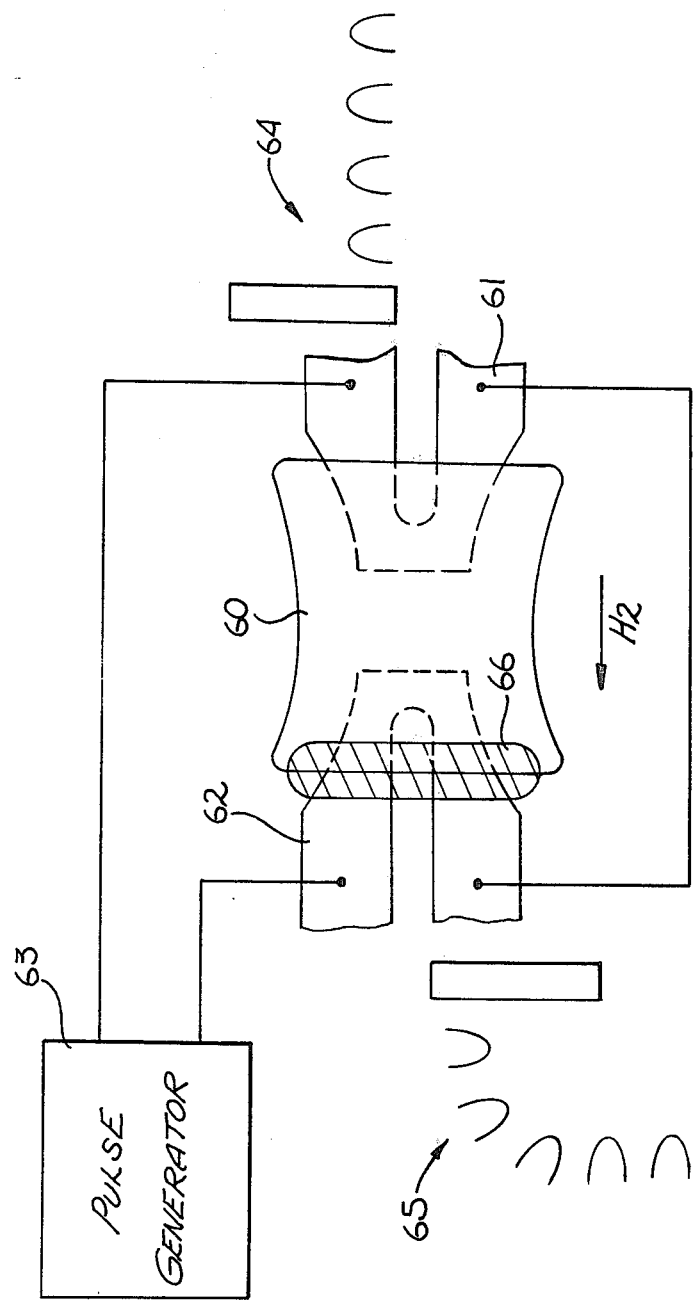
FIG. 2 is a plan view of an alternate embodiment of the present invention where two independent streams of bubbles are generated from a bubble generator which is coupled to a single pulse generator.

Referring now to FIG. 2, an alternate embodiment of the invention is illustrated which includes a single permalloy disc member 60. Two hairpin-shaped conductors 61 and 62 are disposed on opposite sides of the disc member 60. A first propagation circuit 64 is formed adjacent to the conductor 61 to allow movement of bubbles from the disc member 60. Similarly, propagation circuit 65 is formed adjacent to the conductor 62 to transfer bubbles from the disc member 60. The conductors 61 and 62 are coupled in series with a common pulse generator 63.

The bubble generator of FIG. 2 operates in a somewhat similar manner to the generators of FIG. 1. Assume that the in-plane rotating field is in the position indicated by $H_2$. For this position, the seed domain 66 is disposed below the conductor 62. If a pulse is applied to the conductors 61 and 62 at this time, the seed domain 66 is split and a bubble is moved onto the propagation circuit 65. The current through the conductor 61 does not produce a bubble. (The magnetic field caused by the current through the conductors is below the nucleation threshold.) If a bubble is to be generated for the propagation circuit 64, a current pulse is applied when the field is in the direction opposite to the field $H_2$.

Thus, a bubble generation means has been described which permits the generation of two independent streams of bubbles from a single pulse generator.

I claim:

1. In a magnetic apparatus which includes a layer of magnetic material in which single wall domains are moved, an improved domain generation system comprising:

first and second generation means, each for generating domains, electrically coupled in series;

first propagation means for directing domains away from said first generation means, said first propagation means having a first orientation with respect to said first generation means; and, second propagation means for directing domains away from said second generation means, said second propagation means having a second orientation with respect to said second generation means, said second orientation being opposite direction from said first orientation;

whereby said first and second generation means may be coupled to the same signal source to generate two independent streams of domains.

2. The improvement defined by claim 1 wherein each of said generation means includes a hairpin-shaped conductor formed in a first layer above said layer of magnetic material and a permalloy disc member disposed above said conductor, each of said hairpin-shaped conductors being oriented approximately 180° apart.

3. In a magnetic apparatus which includes a layer of material in which single wall domains are moved in response to an in-plane changing magnetic field, improved domain generation means comprising:

first domain generation means for generating first domains when said field is in a first direction; and second domain generation means for generating second domains when said field is in a second direction, said second direction being substantially opposite to said first direction;

whereby with said first and second generation means coupled to common lines, two independent streams of domains may be generated.

4. The generation means defined by claim 3 wherein said first and second generation means are substantially identical and oriented approximately 180° apart.

5. A single wall magnetic domain generator for use in a magnetic arrangement which includes a magnetic layer in which domains are moved under the influence of an in-plane rotating magnetic field comprising:

a first conductor element for generating domains;

a second conductor element for generating domains, said second conductor element being oppositely oriented to said first conductor element;

first propagation circuits originating adjacent to said first conductor for receiving domains generated when said magnetic field is in a first direction; and second propagation circuit originating adjacent to said second conductor for receiving domains generated when said magnetic field is in a second direction, said first direction being opposite to said second direction;

whereby two independent streams of bubbles may be provided on said first and second circuits employing a single source of signals for said first and second conductors.

6. The generator defined by claim 5 wherein said first and second conductors are connected in series.

7. The generator defined by claim 5 wherein said first and second conductors each define a loop.

8. The generator defined by claim 7 wherein said conductors intersect a projection of a single overlying permalloy disc member.

9. The generator defined by claim 7 wherein each of said conductors intersect a projection of a different overlying permalloy disc member.

10. In a magnetic apparatus which includes a layer of material in which single wall domains are moved in response to a changing magnetic field, an improved domain generation means comprising:

a first domain generation means comprising first conductive means for generating domains and first propagation means for moving generated domains away from said first conductive means in response to said changing magnetic field, said first propagation means being oriented with respect to said first conductive means to allow a domain to be moved away from said first conductive means when said field is in a first direction;

a second domain generation means comprising a second conductive means for generating domains and second propagation means for moving generated domains away from said second conductive means in response to said changing magnetic field, said second propagation means being oriented with respect to said second conductive means to allow a domain to be moved away from said second conductive means when said field is in a second direction;

said orientation of said first conductive means and first propagation means preventing a domain from being moved away from said first conductive means when said field is in said second direction;

said orientation of said second conductive means and second propagation means preventing a generated domain from being moved away from said second conductive means when said field is in said first direction;

whereby said first and second conductive means may be coupled to a common pulse source and said first and second generation means used to generate two independent streams of domains.

* * * * *